United States Patent
Ohshita et al.

(10) Patent No.: US 7,264,843 B2
(45) Date of Patent: Sep. 4, 2007

(54) ORGANIC ELECTROLUMINESCENT PANEL AND PRODUCING METHOD OF THE SAME

(75) Inventors: Isamu Ohshita, Yamagata (JP); Takashi Yahagi, Yamagata (JP); Hiroyuki Kura, Yamagata (JP); Masatoshi Yamaki, Yamagata (JP); Hiroshi Itoh, Yamagata (JP)

(73) Assignee: Tohoku Pioneer Corporation, Yamagata (JP)

( * ) Notice: Subject to any disclaimer, the term of this patent is extended or adjusted under 35 U.S.C. 154(b) by 296 days.

(21) Appl. No.: 10/847,352

(22) Filed: May 18, 2004

(65) Prior Publication Data

US 2004/0232829 A1 Nov. 25, 2004

(30) Foreign Application Priority Data

May 21, 2003 (JP) ............................ P2003-143059

(51) Int. Cl.
*B05D 5/06* (2006.01)
*B05D 1/32* (2006.01)

(52) U.S. Cl. ........................................ 427/66; 427/282

(58) Field of Classification Search ...................... None
See application file for complete search history.

(56) References Cited

U.S. PATENT DOCUMENTS

2001/0001050 A1* 5/2001 Miyashita et al. .......... 428/690
2002/0076847 A1* 6/2002 Yamada et al. ............... 438/34
2002/0187265 A1* 12/2002 Mori et al. .................. 427/282
2002/0197393 A1* 12/2002 Kuwabara ..................... 427/66
2003/0030370 A1* 2/2003 Tada .......................... 313/504
2004/0142108 A1* 7/2004 Atobe et al. ................ 427/282

FOREIGN PATENT DOCUMENTS

| JP | 2000-48954 A | 2/2000 |
| JP | 2001-237068 A | 8/2001 |
| JP | 2002-367787 A | 12/2002 |

* cited by examiner

*Primary Examiner*—Keith Hendricks
*Assistant Examiner*—Jimmy Lin
(74) *Attorney, Agent, or Firm*—Sughrue Mion Pllc.

(57) ABSTRACT

An organic electroluminescent element formed on a substrate has a layer structure in which organic layer including an organic electroluminescent layer is sandwiched between a pair of electrodes. A film formation region of an emission layer which is made of a uniform film forming material in accordance with one opening of a film forming mask is formed by plural layers including a first emission layer and a second emission layer. The layers are formed at each setting of the film forming mask.

7 Claims, 7 Drawing Sheets

ORGANIC ELECTROLUMINESCENT PANEL AND PRODUCING METHOD OF THE SAME

BACKGROUND OF THE INVENTION

1. Field of the Invention

The present invention relates to an organic electroluminescent panel and a producing method thereof.

2. Description of the Related Art

In an organic electroluminescent (Hereinafter, referred to "EL") panel, a surface-emitting element due to luminescent areas of an organic EL element is formed on a substrate. A single or plural surface emitting elements are arranged to form a display region. A lower electrode having one of various structures is formed on a substrate. A film pattern of organic layers including an organic electroluminescent layer is then formed, and an upper electrode is formed on the film pattern. When the film pattern is formed, a film forming mask which has openings corresponding to the pattern shape is used, and a desired pattern is formed by a film forming method such as the mask vapor deposition method.

The pattern formation of the organic layers by using a film forming mask will be described. Usually, luminescent areas of an organic EL element are defined by an insulating film formed on a substrate. A film pattern of organic layers is formed on the luminescent areas by using a film forming mask having an opening which is slightly larger in size than the luminescent areas. In the case of plural-color display, film forming masks respectively having openings corresponding to electroluminescent color patterns are used. The masks are adequately replaced with one another or slid so that organic electroluminescent layers of different colors are formed (See JP-A-2002-367787).

The organic layer refers to layer having an organic electroluminescent layer constituting organic EL (such as an emission layer, a hole-transport layer, an electron-transport layer, a hole-injection layer, and an electron-injection layer) which include an organic electroluminescent layer, and which are to be stacked above and below the organic electroluminescent layer. An organic EL element is not restricted to have plural organic layers, and may consist of a single layer, or only an organic electroluminescent layer. For a hole-transport layer and an electron-transport layer which are usually made of a single material on the same substrate, film forming masks having different patterns for respective electroluminescent colors are often used in order to control the film thickness in respective electroluminescent color regions (See JP-A-2001-237068).

In the case of a single-color display, a film forming mask having a predetermined pattern (for example, a stripe shape) corresponding to a luminescent areas is used. In order to avoid the strength of the mask from being reduced by excessive density of openings, a film pattern of organic layers is formed in a display region while the formation pitch of the openings is enlarged, and plural film formation steps are conducted (See JP-A-2000-48954).

The pattern formation using the film forming mask is often employed not only in the above-described pattern formation of the organic layers, but also in pattern formation of other components of an organic EL element, such as upper and lower electrodes, an insulating film, and a sealing film.

Hereinafter, a film formation region refers to a region which forms each organic EL element in accordance with an opening of the film forming mask. The film formation region set by a design of the openings of the film forming mask. The film formation region is set by, for example, the width or length of the opening or the position of the opening in the film forming mask.

In case where the film forming mask uses, when an organic EL panel, the pattern formation of components such as organic layers, electrodes, an insulating film, and a sealing film uses a film forming mask are produced, a film forming material, dust, or the like (attachment substance a) sometimes adheres to an opening 1A of a film forming mask 1. (Please see FIG. 1A) Alternatively, as shown in FIG. 1B, there is a partial design fault portion b with respect to the opening width 1h of the opening 1A. When the film forming mask 1 having defects in the opening 1A uses for film formation, a film formation region has an unformed portions c as shown in FIG. 1C. The unformed portions c is formed in accordance with the attachment substance and the design fault portion b, whereby the following problems are caused.

A thin-thickness portion is partially formed in the organic layers interposed between upper and lower electrodes, thereby causing the possibility that a leakage current flows between the upper and lower electrodes so that the emitted light cannot be obtained in a pixel having such a defective film formation region. When a pattern of emission layer is formed, the unformed portion c of the film formation region is formed so that the emission area of the emission layer is reduced and the brightness of the emission is lowered. Additionally, when a layer, which is adjacent to the emission layer, having an electroluminescent is formed on the unformed regions of the film formation region, the color of the emitted light, which is different from predetermined one, is produced so that the chromaticity is changed. This will be described more specifically. When an electron-transport layer made of $Alq_3$ or the like is formed in the unformed portion of red-emitting layer, green emitted-light is produced therefrom, so that the predetermined chromaticity cannot be attained in the unit luminescent areas.

In pattern formation of the electrodes, the electric resistance partially changes due to an unformed portion, so that a predetermined injection current cannot be obtained. In pattern formation of the insulating film or the sealing film, there is the problem in that the insulating or sealing performance is lowered by an unformed portion. The invention is proposed in order to solve these problems.

SUMMARY OF THE INVENTION

It is an object of the invention to provide an organic Electroluminescent (hereinafter, referred to "EL") panel and a method of producing it in which, even when a defect such as an attachment substance or a partial design fault exists in an opening of a film forming mask, an unformed portion is not formed in a designed film growth region, and functions of various portions corresponding to a preset film growth region can be exerted.

It is an another object of the invention such as that, In an organic EL panel and a method of producing it, an unformed portion of a film growth region related to a component of an organic EL element is eliminated to prevent a leakage current from flowing, that partial brightness or chromaticity change is prevented from occurring, and that excellent insulating and sealing performances are ensured.

To achieve the above-objects, the invention has at least elements regarding aspects of the invention as described below.

According to one aspect of the invention, there is provided with an organic electroluminescent panel in which an organic electroluminescent element configured by sandwiching an organic layer including an organic electroluminescent layer between a pair of electrodes is formed on a substrate, wherein one film formation region related to the organic electroluminescent element which is made of a uniform film forming material in accordance with one opening of the film forming mask is formed by plural layers which are formed respectively at each setting of the film forming mask.

According to another aspect of the invention, there is provided with a producing method of an organic electroluminescent panel, including the steps of:

preparing an organic electroluminescent element including an organic layer having an organic electroluminescent layer sandwiched between a pair of electrodes;

performing a setting of film formation mask; and multiple-forming at each setting of the film formation mask one film formation region related to the organic electroluminescent and formed by a uniform film forming material in accordance with one opening of the film forming mask.

DESCRIPTION OF THE PREFERRED EMBODIMENTS

Hereinafter, embodiments of the invention will be described with reference to the accompanying drawings. An organic electroluminescent (hereinafter, referred to "EL") panel and a method of producing it according to an embodiment of the invention are based on the premise that at least one of components of the organic EL element is formed by pattern formation using a film forming mask.

Figure 1A:
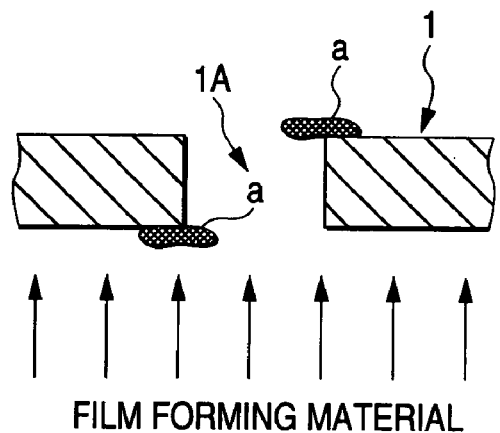
FIGS. 1A, 1B and 1C are diagrams illustrating problems of the related art.
Figure 1B:
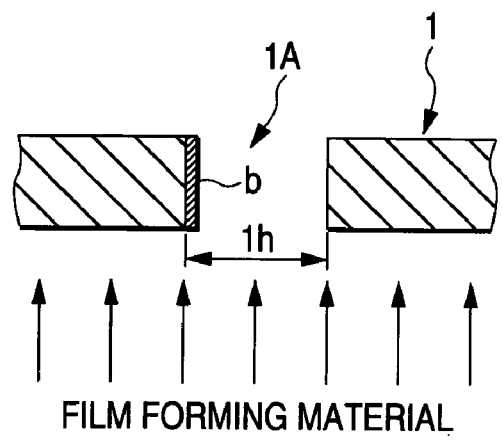
Figure 1C:
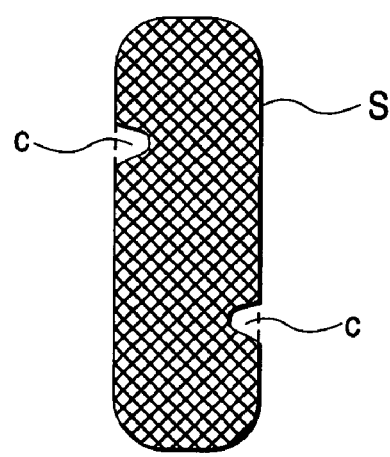
Figure 2A:
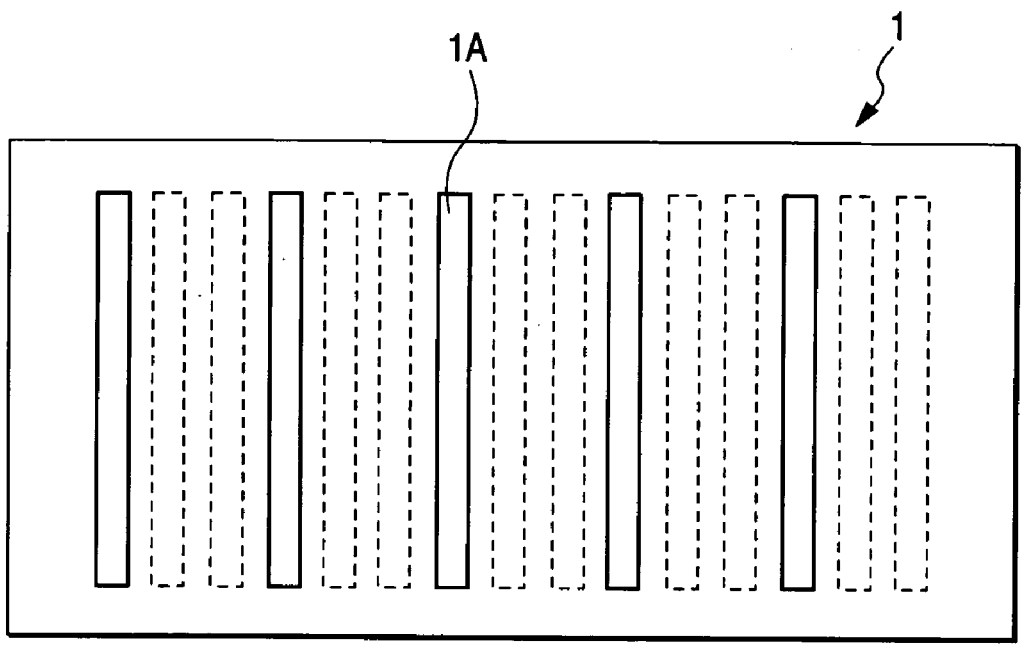
FIGS. 2A and 2B are views showing film forming masks which is used in a producing method of an organic electroluminescent panel according to the embodiments.
Figure 2B:
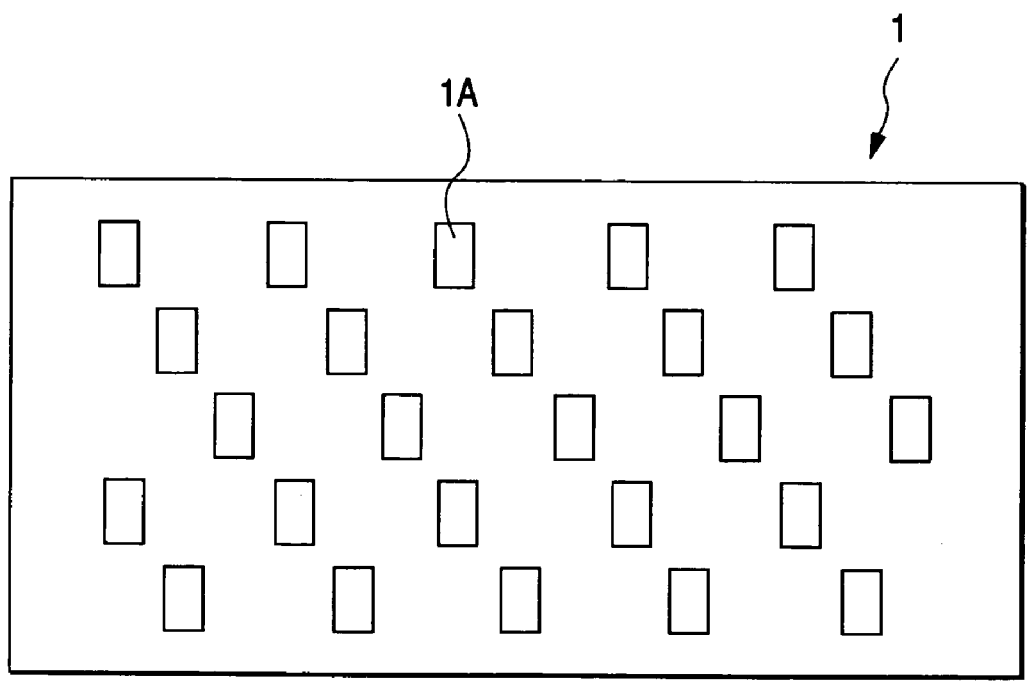

FIGS. 2A and 2B show example of a film forming mask used in the embodiment. In FIG. 2A, a film forming mask 1 has openings 1A which is formed in stripe shape. The openings 1A are arranged in parallel with each other at predetermined intervals. The film forming mask may be used, for example, in case where emission layers of multi colors are formed in a pattern arrangement where unit luminescent areas of the same color are linearly arranged. In FIG. 2A, each of intervals between the openings 1A allows to form two openings corresponding to the film formation regions when the three colors is arranged. In FIG. 2B, a film forming mask 1 has rectangular openings 1A which are arranged to be staggered. The mask may be used in the case where emission layers of multi colors are formed in a pattern arrangement where unit luminescent areas of the same color are arranged to be staggered.

In the following description, the film forming mask 1 shown in FIG. 2A will be described as an example. However, embodiments of the invention are not restricted to this. A film forming mask having the pattern shown in FIG. 2B may be similarly employed, and alternatively a film forming mask having another mask pattern may be employed.

In the following description, film formation of an emission layer will be described as an example. However, embodiments of the invention are not restricted to this, and can be applied also to pattern formation of another component of an organic EL element.

Figure 3:
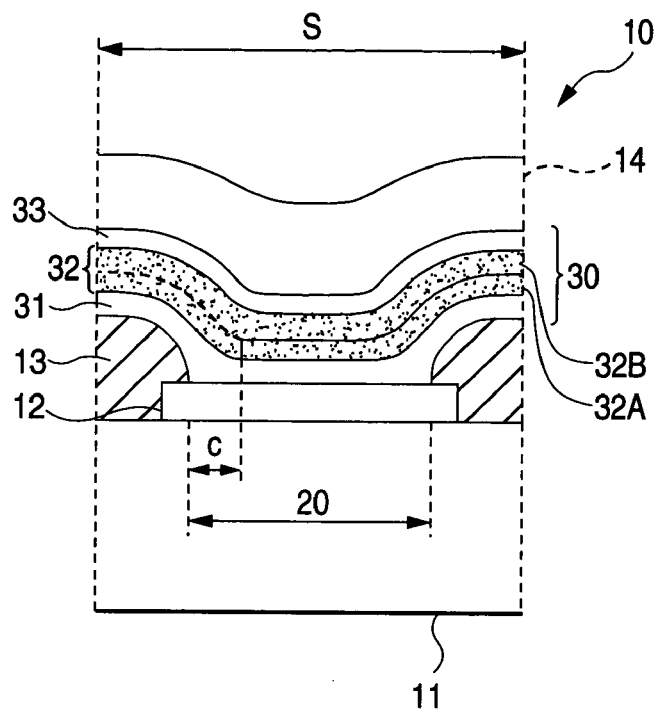
FIG. 3 is a diagram showing the structure of an organic electroluminescent element in the organic electroluminescent panel according to the embodiments.

FIG. 3 is a diagram showing the structure of an organic EL element in an organic EL panel of the embodiment of the invention. The organic EL element 10 formed on a substrate 11 has a layer structure in which organic layers including an organic electroluminescent layer is sandwiched between a pair of electrodes. More specifically, an insulating film 13 is formed to surround a lower electrode 12 formed on the substrate 11. A region which is above the lower electrode 12, and which is defined by the insulating film 13 is set as luminescent areas 20 organic layers 30 are formed on the lower electrode 12 in the luminescent areas 20. An upper electrode 14 is formed on the organic layers 30. In this example, the organic layers 30 have a three-layer stacked structure of a hole-transport layer 31, a emission layer 32, and an electron-transport layer 33. The stacked structure is not particularly restricted to this. The upper electrode 14 may be covered by a sealing film.

According to the embodiment of the invention, in the organic EL element 10, one film formation region is formed by plural layers which are formed respectively at different settings of the film forming mask. The one film formation region is related to one component of the organic EL element, and which is made of a uniform film forming material in accordance with one opening of the film forming mask. In the example shown in FIG. 3, a film formation region S of the emission layer 32 which is made of a uniform film forming material in accordance with one opening of the film forming mask is formed by plural layers or a first emission layer 32A and a second emission layer 32B. The layers 32A, 32B are formed at settings of the film forming mask, respectively.

According to the example, even in the case where, in the formation of the first emission layer 32A, an attachment substance or a partial design fault exists in the opening of the film forming mask and an unformed portion c is formed, there is no possibility that another unformed portion c is overlappingly formed in the same place in the subsequent film formation process. Therefore, the second emission layer 32B which is to be subsequently formed is formed to cover the unformed portion c which has been formed, with result that it is possible to form the single film formation region S in which no unformed portion c exists as a whole.

Figure 4:
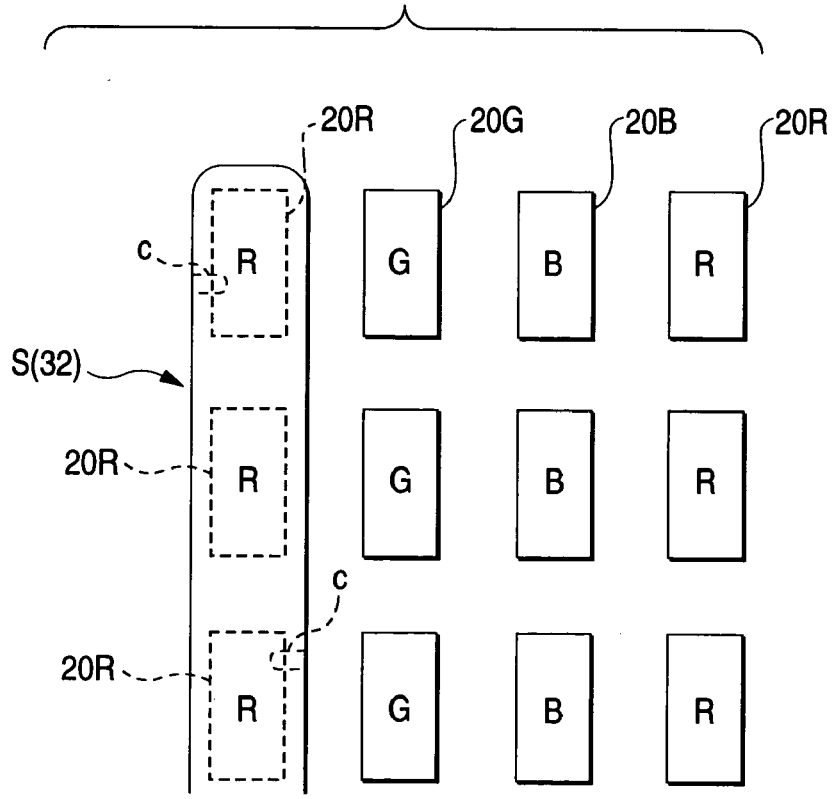
FIG. 4 is a diagram illustrating the organic EL panel and the producing method thereof according to the embodiment, and showing the organic EL panel in plan view.

FIG. 4 is a diagram illustrating the organic EL panel and the method of producing it according to the embodiment of the invention, and showing the organic EL panel in plan view. When the film forming mask 1 shown in FIG. 2A is used to form luminescent areas 20R, 20G, or 20B, a film formation region S of the emission layer 32 formed in accordance with the opening 1A is formed in stripe shape as shown in FIG. 4. each of zones has the same color emitting light, and is linearly arranged.

In the method of producing the organic EL panel, when one film formation region S related to the component of the organic EL element 10, which is made of a uniform film forming material, formed in accordance with one opening 1A of the film forming mask 1, film formation is performed at each time when the setting of the film forming mask 1 is changed. Specifically, when the film formation region S of the emission layer 32 which is one of the components of the organic EL element 10 is to be formed to a predetermined thickness by a uniform film forming material, the first emission layer 32A is first formed in accordance with the opening 1A of the film forming mask 1. Then, the setting of the film forming mask 1 is changed, and the second emission layer 32B is formed on the first emission layer 32A by the same material. Even when an unformed portion c is formed by a partial defect of the opening 1A during the forming process of the first emission layer 32A, therefore, the second emission layer 32B in which another unformed portion c does not overlap with the unformed portion c is formed on the first emission layer as described above. As a result, the single film formation region S in which no unformed portion c exists as a whole can be formed. In the illustrated example, in order to form the red emitting layer 20R, the film formation region S made of a material which emits red luminescence is formed. As a red luminescent material, for example, a material in which $Alq_3$ is used as a host material and DCJTB (a product of Eastman Kodak Company) is used as a guest material can be employed.

As other embodiments, hereinafter, specific examples of changing of setting of the film forming mask will be described.

In a first example, setting of a film forming mask is changed by moving an identical film forming mask by a distance which is equal to or smaller than a design margin of an opening. The term "design margin of an opening" means the width described below. Usually, a film forming mask is designed so that the size of each opening is slightly larger than the film formation region. The film forming mask has a margin which allows to be completely covered by a film forming material. In a state where the film forming mask is placed so that the center of the mask coincides with that of the film formation region, a marginal width is set between an outer edge of the film formation region and that of the opening. The width refers to "design margin of an opening". In the description, the movement of the film forming mask includes oscillation at an amplitude which is not larger than the design margin.

Figure 5A:
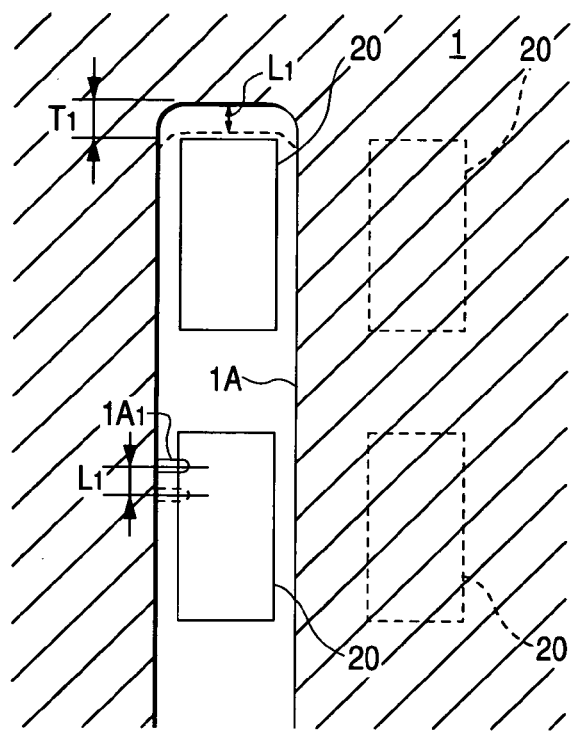
FIGS. 5A and 5B are diagrams illustrating an embodiment (formation of emission layer)
Figure 5B:
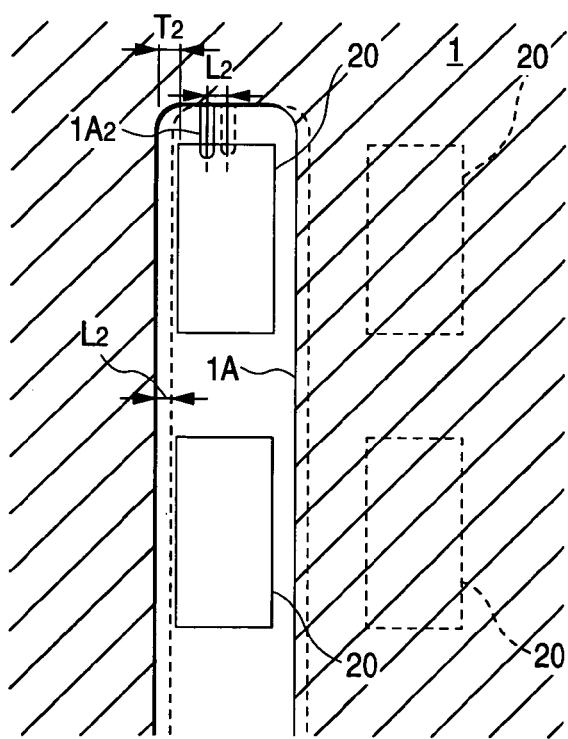

The embodiment will be described with reference to FIGS. 5A and 5B with taking as an example the case where the above-described emission layer 32 is formed. The opening 1A of the film forming mask 1 is placed on the position indicated by the solid line. The first emission layer 32A (not shown) is first formed on the luminescent areas 20. As shown in FIG. 5A, the film forming mask 1 is moved in the longitudinal direction of the stripe opening 1A by a distance $L_1$ which is equal to or smaller than a design margin $T_1$ in the longitudinal direction of the opening 1A, and the second emission layer 32B (not shown) is then grown. Alternatively, as shown in FIG. 5B, the film forming mask 1 may be moved in the lateral direction of the stripe opening 1A by a distance $L_2$ which is equal to or smaller than a design margin $T_2$ in the lateral direction of the opening 1A, and the second emission layer 32B (not shown) may be then grown. Although the movements in the longitudinal and lateral directions of the opening 1A are shown in this example, movement in any direction may be conducted as far as the movement distance is equal to or smaller than a design margin.

Even when a defect $1A_1$ or $1A_2$ which will cause an unformed portion exists in the opening 1A and an unformed portion is formed in the emission layer in the formation process of the first emission layer, therefore, the defect $1A_1$ or $1A_2$ which will cause an unformed portion is moved by $L_1$ or $L_2$ in the process of growing the second emission layer. The emission layer is formed also on the unformed portion in the emission layer, with the result that a single film formation region in which no unformed portion exists as a whole is formed.

Figure 6:
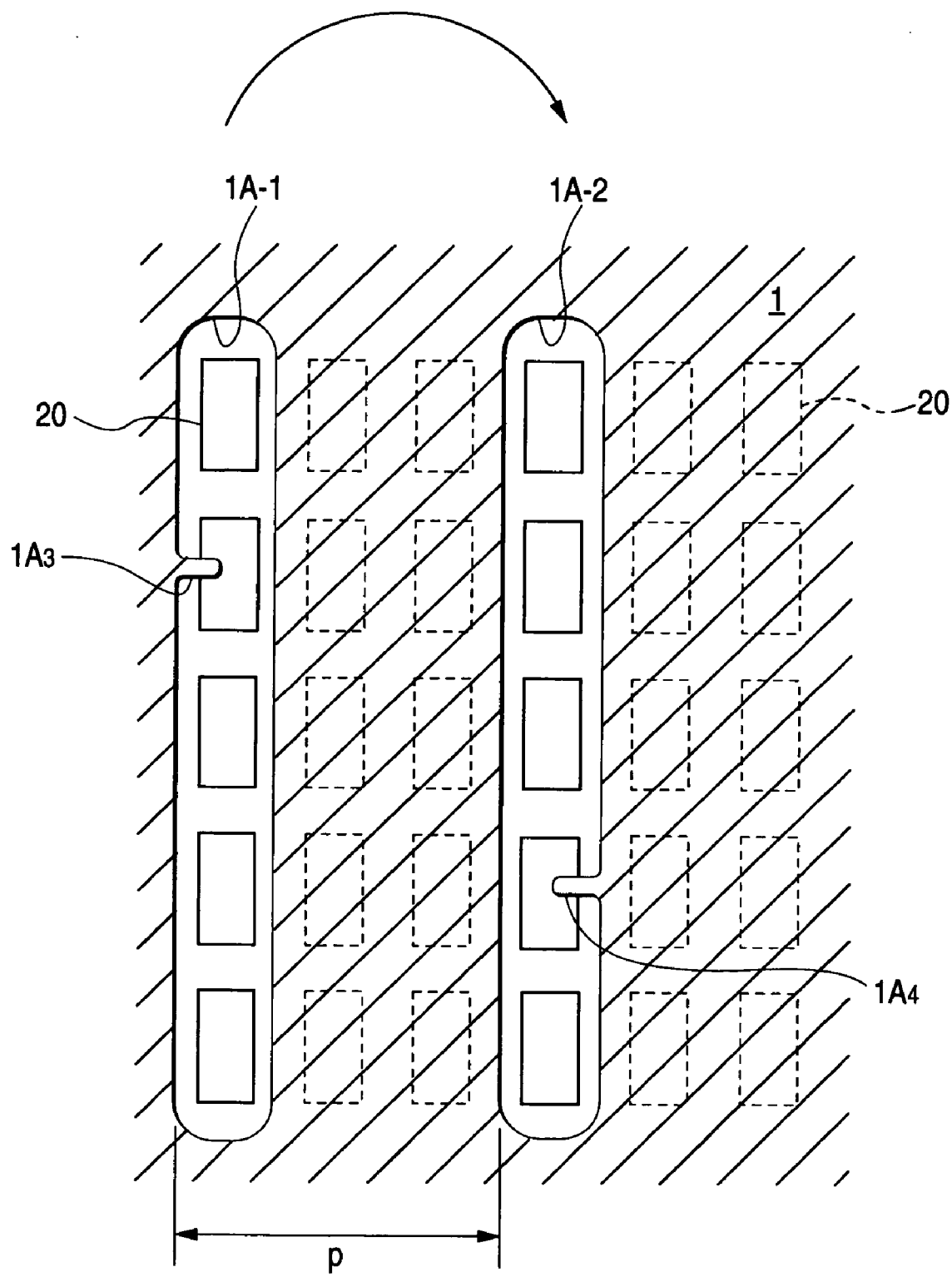
FIG. 6 is a diagram illustrating an embodiment (formation of emission layer)

In a second example as shown in FIG. 5B, setting of a film forming mask is changed by moving different openings of an identical film forming mask having a pattern in which openings of the same shape are placed at a predetermined pitch, onto a film formation region. The embodiment will be described with reference to FIG. 6 with taking as an example the case where the above-described emission layer 32 is formed. The film forming mask 1 has a pattern in which stripe openings 1A-1, 1A-2, . . . are arranged at pitch p. The first emission layer is formed by using the film forming mask 1 which is placed in the illustrated state. Then, the film forming mask 1 is moved by a distance which is equal to an integer multiple of the pitch p, so that, for example, the opening 1A-1 is placed on the film formation region which has been grown by using the opening 1A-2. Thereafter, the second emission layer is formed.

According to the configuration, even when a defect $1A_3$ exists in the openings 1A-1, a defect $1A_4$ exists in the opening 1A-2, and the defects respectively cause unformed portions to be formed in the process of growing the first emission layer, it is considered that the defects of the openings do not exist in the same place, and hence the emission layer is grown in the process of growing the second emission layer, also on the unformed portion in the first emission layer. As a result, a single film formation region in which no unformed portion exists as a whole is formed.

Figure 7A:
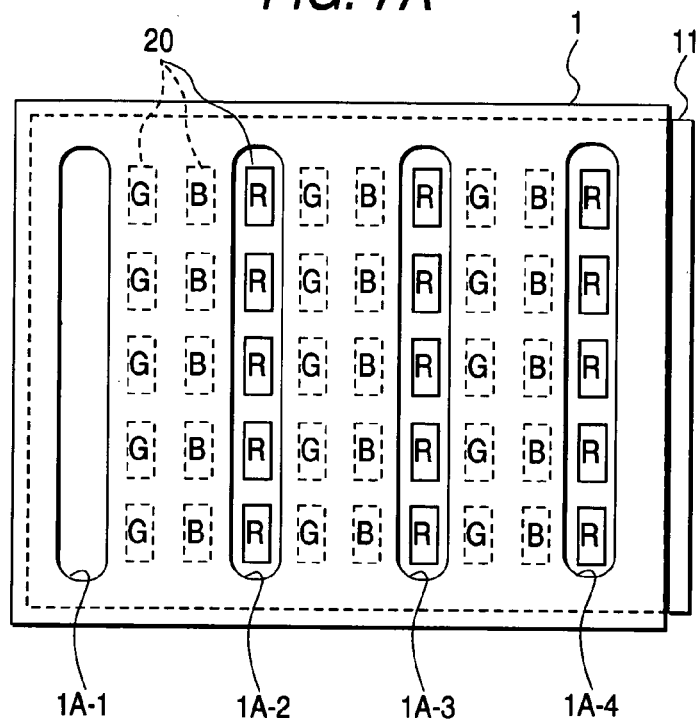
FIGS. 7A and 7B are views showing a specific example of the embodiment.
Figure 7B:
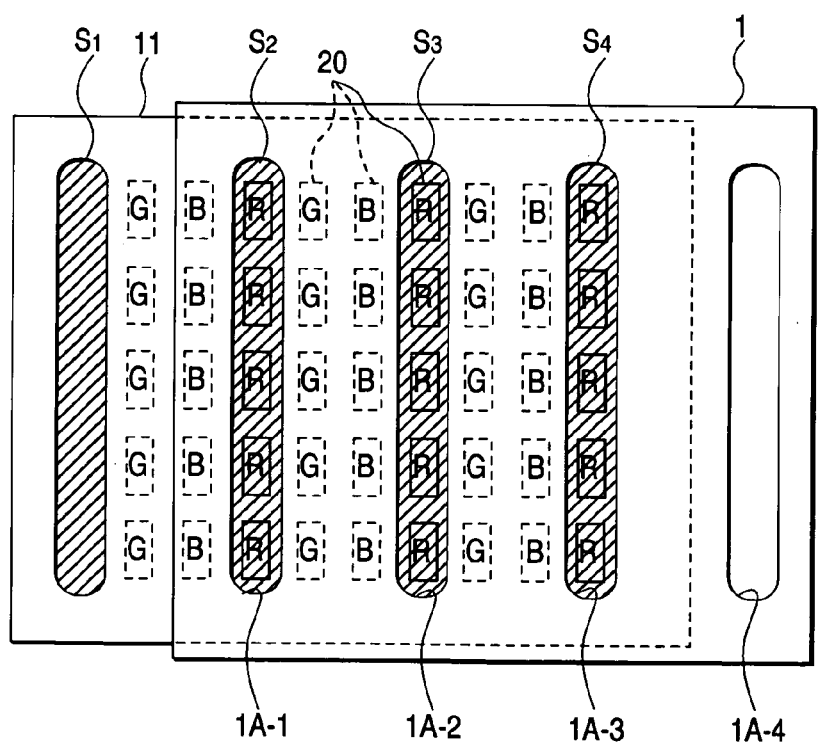

FIG. 7 shows a specific example of the embodiment. In this example, opening 1A-1 to 1A-4 the number of which is larger than that of film formation region s that are to be patterned by the film forming mask 1 are formed in the film forming mask 1. After a first film formation process, the film forming mask 1 is shifted by one pitch p, and a second film formation process is then conducted. In the illustrated example, emission layers are colored into three colors R, G, and B, and three places where a red emission layer is to be formed exist on the substrate 11. By contrast, the four openings 1A-1 to 1A-4 are formed in the film forming mask 1. The film forming mask 1 is placed in the state shown in FIG. 7A, and the first emission layer is then formed. As shown in FIG. 7B, the film forming mask 1 is moved by one pitch p. On the film formation region $S_1$ to $S_4$ where the first emission layer has been formed, a second emission layer of the same material is then formed.

In a third example, setting of a film forming mask is changed by replacement to a different film forming mask having the same pattern. Referring again FIG. 6, the embodiment will be described with taking as an example the case where a emission layer is grown. First, a first emission layer is formed by using the film forming mask 1 which is placed in the illustrated state. Then, the film forming mask 1 is replaced with another film forming mask having the same pattern, and a second emission layer of the same material is grown.

According to the configuration, even when an unformed portion is formed in the film formation process of the first emission layer by using the film forming mask 1, a defect does not exist in the same places of the different film forming masks, and hence the emission layer is formed in the film formation process of the second emission layer, also on the unformed portion in the first emission layer. As a result, a single film formation region in which no unformed portion exists as a whole is formed.

In the embodiments described above, the film formation of the emission layer 32 is conducted by the two processes of respectively growing the two layers or the first emission layer 32A and the second emission layer 32B. Alternatively, the emission layer may be divided into plural or three or more sublayers, and the emission layer may be formed by plural film formation processes.

When a film formation region where no unformed portion exists in the process of growing an emission layer is formed as in the above-described embodiments, the emission area can be prevented from being reduced, so that a preset brightness can be ensured. Furthermore, an EL layer which is adjacent to the emission layer is not formed in an unformed portion. Therefore, an electroluminescent color, which is different from the preset one, does not occur, and the chromaticity is not changed. As a result, even when dust or the like attaches to an opening of a film forming mask or a defect such as a partial design fault exists in the opening itself, excellent luminescence performance can be ensured.

Although the embodiments have been described with focusing on the film formation of the emission layer, the invention is not limited to them. The invention can be applied also to a pattern formation process using a film forming mask, on components of an organic EL element, such as another organic layer (irrespective of whether the layer is one which is formed so as to correspond to the electroluminescent color, or one which is formed so as to be common to all colors), an electrode, an insulating film, and a sealing film. In pattern formation of an electrode, elimination of an unformed portion allows the electric resistance to be uniformalized, whereby driving can be stabilized in the whole display screen. In pattern formation of an insulating film or a sealing film, elimination of an unformed portion enables an excellent insulating or sealing performance to be ensured.

Although the embodiments have been described with focusing on an organic EL panel which is formed so as to emit multi colors, the organic EL panel of the invention is not restricted to such a panel, and may be a panel of monochromatic luminescence, or plural- or two or more-color luminescence. In order to realize an organic EL panel of plural-color luminescence, anyone of methods including the above-described separate-color region method can be employed as far as the method uses a film forming mask to form a film formation region Examples of such methods are: a method (CF method or CCM method) in which a luminescent layer of a mono-color such as white or blue is combined with a color converting layer based on a color filter or a fluorescent layer; a method (photobleaching method) in which plural-color luminescence is realized by, for example, irradiating a emission layer of a mono-color luminescent layer with an electromagnetic wave; and a printing method which uses a polymer material.

EXAMPLES

Hereinafter, specific examples of constituting members of an organic EL panel in which the above-described embodiments can be employed. A production steps will be described as examples of the invention.

Figure 8:
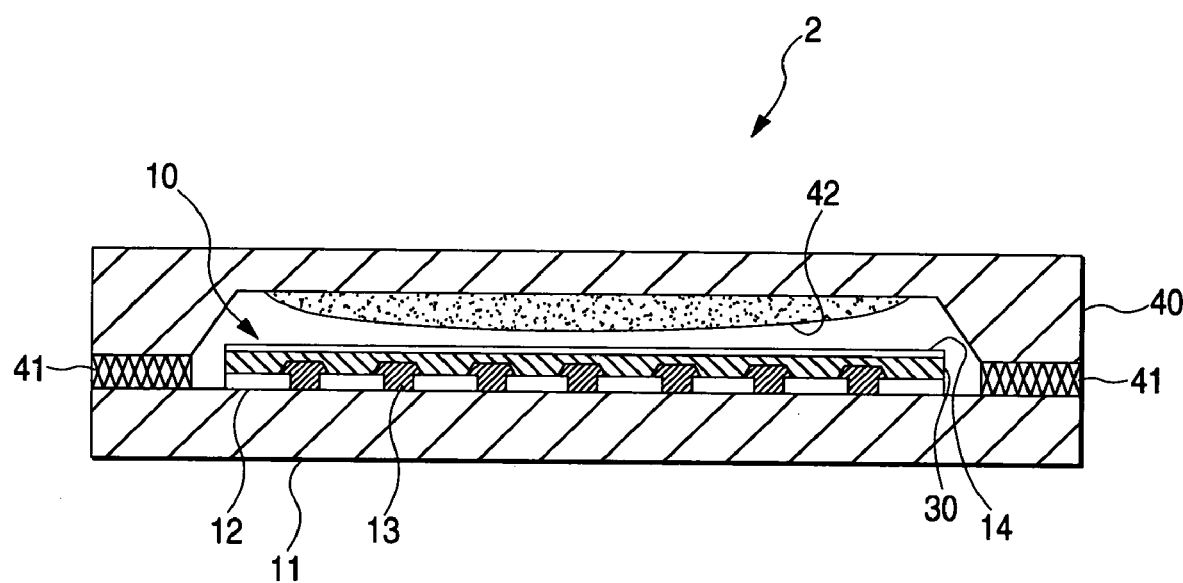
FIG. 8 is a section view illustrating an organic EL panel of an example of the invention.

FIG. 8 is a sectional view schematically showing the structure of an organic EL panel which is an example of the invention.

In the organic EL panel 2, the above-described organic EL element 10 is formed on the substrate 11. As described above, the organic EL element 10 has a structure in which the organic layers 30 are sandwiched between the pair of the lower electrode 12 and the upper electrode 14, and the insulating film 13 partitions the lower electrode 12 so as to form unit luminescent areas. A sealing member 40 which covers the organic EL element 10 is bonded via an adhesive agent 41 onto the substrate 11. A desiccant 42 is attached to the inner face of the sealing member 40.

Hereinafter, each of the components will be described more specifically.

a. Electrodes: Either of the lower electrode 12 and the upper electrode 14 can be used as an anode or a cathode. The anode is made of a material having a work function which is higher than that of the cathode, or configured by a film of a metal such as chromium (Cr), molybdenum (Mo), nickel (Ni), or platinum (Pt), or a transparent conductor film of, for example, a metal oxide film such as ITO or IZO. By contrast, the cathode material has a work function which is lower than that of the anode. The cathode material may be aluminum (Al) or magnesium (Mg), an amorphous semiconductor such as doped polyaniline or doped polyphenylene-vinylene, or an oxide such as $Cr_2O_3$, NiO, or $Mn_2O_5$. In the case where both the lower and upper electrodes are made of a transparent material, a configuration is employed in which a reflection film is disposed on the side of the electrode opposite to the light emission side.

b. Organic layers (organic electroluminescent layer): Usually, the organic material layers 30 are formed by a combination of the hole-transport layer 31, the emission layer 32, and the electron-transport layer 33 as in the above-described embodiment (see FIG. 3). Alternatively, plural emission layers 32, hole-transport layers 31, and electron-transport layers 33 may be stacked in place of a single-layer stack. One or both of the hole-transport layer 31 and the electron-transport layer 33 may be omitted. Organic layers such as a hole-injection layer and an electron-injection layer may be inserted in accordance with the usage of the panel. The materials of the hole-transport layer, the emission layer, and the electron-transport layer can be suitably selected from conventionally known materials (including a fluorescent material, a phosphorus material, a low-molecular weight material, and a polymer material).

c. Adhesive agent: As the adhesive agent 41, useful are adhesive agents such as those of the thermosetting type, the chemical-setting (two-component) type, and the photo (UV) setting type. As the material of the adhesive agent, an acrylic resin, an epoxy resin, polyester, polyolefin, or the like can be used. The use of a UV curing epoxy resin is particularly preferable.

d. Desiccant: The desiccant 42 is formed by: a physical desiccant such as zeolite, silica gel, carbon, or carbon nanotubes; a chemical desiccant such as an alkali metal oxide, a metal halide, or chloride peroxide; a desiccant in which an organic metal complex is dissolved in a petroleum solvent such as toluene, xylene, or an aliphatic organic solvent; or a desiccant in which desiccant particles are dispersed in a transparent binder such as polyethylene, polyisoprene, or polyvinyl cinnamate.

e. Sealing member (sealing film): The sealing member 40 can be configured by a member such as: that in which a sealing recess (such as a one-step depression, or a two-step depression including a depression for placement of the desiccant) is formed by a process such as press molding, etching, or blasting in a sealing substrate that can be selected from glass, plastic, or metal, and preferably made of glass; or that in which plate glass is used, and which cooperates with a supporting substrate to form a sealing space by means of spacers made of glass (or plastic). The sealing configuration is not limited to them, and the organic EL element 10 may be sealed by a sealing film. The sealing film can be formed by a single-layer film or a stack of plural protective films. The sealing film may be made of either one of an inorganic material and an organic material. Examples of an inorganic material are: nitrides such as SiN, AlN, and GaN; oxides such as SiO, $Al_2O_3$, $Ta_2O_5$, ZnO, and GeO; carbonitrides such as SiCN; metal fluorides; and metal films. Examples of an organic material are an epoxy resin, an acrylic resin, polyparaxylene, fluorinated polymers (perfluoroolefin, perfluoroether, tetrafluoroethylene, chrolotrifluoroethylene, dichrolodifluoroethylene, and the like), metal alkoxides ($CH_3OM$, $C_2H_5OM$, and the like), a polyimide precursor, and a perylene compound. The manner of stacking, and the material are adequately selected in accordance with the design of the organic EL element.

f. Production method: The organic EL element 10 is produced in the following manner. First, the lower electrode 12 of ITO or the like functioning as an anode is formed in the form of a thin film on the glass substrate 11 by a method such as vapor deposition or sputtering, and then patterned to a desired shape by photolithography. Next, the organic layers 30 are formed by: a wet process including a coating method such as the spin coating method, or the dipping method, and a printing method such as the screen printing method or the ink jet method; or a dry process such as the vapor deposition method or the laser transfer method. For example, materials of a hole-transport layer, a emission layer, an electron-transport layer are sequentially stacked by the vapor deposition method.

At this time, the above-described film forming mask 1 is used in the formation of the emission layer, so that separate color emission layers are formed in accordance with plural electroluminescent colors. In the formation of separate colors, an organic material which produces luminescences of three colors or RGB, or a combination of organic materials forms a emission layer in pixel regions corresponding to RGB. As in the embodiment described above, film growth using the same material is conducted two or more times on one luminescent areas, whereby an unformed portion is prevented from being produced in the luminescent areas.

Finally, the upper electrode 14 in the form of a metal thin film is formed as a cathode configured by several stripes which are orthogonal to the lower electrode 12, so that a matrix structure is formed by the lower electrode 12 and the upper electrode 14. The thin film of the upper electrode 14 is formed by a method such as vapor deposition or sputtering.

A step of sealing the sealing member 40 and the substrate 11 via the adhesive agent 41 is conducted in the following manner. An adequate amount (about 0.1 to 0.5 wt. %) of spacers (preferably, spacers made of glass or plastic) having a diameter of 1 to 300 m is mixed with an adhesive agent of a UV curing epoxy resin. The mixture is applied by using a dispenser or the like to a place of the substrate 11 corresponding to the side wall of the sealing member 40. Under an atmosphere of an inert gas such as argon gas, thereafter, the sealing member 40 butts against the substrate 11 via the adhesive agent 41. The adhesive agent 41 is then irradiated with UV rays from the side of the substrate 11 (or from the side of the sealing substrate) to be cured. In this way, the organic EL element 10 is sealed in the state where the sealing space between the sealing member 40 and the substrate 11 is filled with the inert gas such as argon gas.

A design change which is applied to the examples without departing from the configuration of the invention falls within the scope of the invention. In place of the passive driving method, for example, the active driving method in which the panel is driven by TFTs may be employed as the method of driving the organic EL panel. The light emission from the organic EL element 10 may be of the bottom emission type in which light is emitted from the side of the substrate 11, or of the top emission type in which light is emitted in the opposite direction.

According to the embodiments and experiments which are configured as described above, even when a defect such as an attachment substance or a partial design fault exists in an opening of a film forming mask, an unformed portion is not formed in a designed film formation region, and functions of various portions corresponding to a preset film formation region can be exerted. Specifically, in an organic EL panel and a method of producing it, an unformed portion of a film formation region is eliminated, so that a leakage current can be prevented from flowing, partial brightness or chromaticity change can be prevented from occurring, and excellent insulating and sealing performances can be ensured.

What is claimed is:

1. A producing method of the organic electroluminescent panel, comprising:
    preparing an organic electroluminescent element including an organic layer having an organic electroluminescent layer sandwiched between a pair of electrodes;
    wherein the organic electroluminescent element corresponds to a film formation region that is formed of multiple layers of a film forming material formed on each other by multiple-setting of a film forming mask and respectively multiple-forming with the same film forming material, and
    wherein the setting of the film forming mask is changed by moving different openings of the film forming mask onto the film formation region, the film forming mask having openings formed of the same shape is moved by a distance equal to an integer multiple of a pitch.

2. A producing method of an organic EL panel, comprising,
    preparing an organic electroluminescent element including an organic layer having an organic electroluminescent layer sandwiched between a pair of electrodes;
    forming a first component of the organic electroluminescent element with an opening of a first film forming mask by a film forming material;
    replacing the first film forming mask with a second film forming mask having a same pattern of openings; and
    forming a second component of the organic electroluminescent element on the first component of the organic electroluminescent element by the same film forming material with a first opening of the second film forming mask that corresponds to the opening of the first film forming mask.

3. The producing method of the organic EL panel according to claim 2, wherein replacing the first film forming mask with the second film forming mask and forming the second component of the organic electroluminescent element diminish a potential defect in the organic electroluminescent element.

4. A producing method of the organic electroluminescent panel, comprising preparing at least an organic electroluminescent element including at least an organic layer having an organic electroluminescent layer sandwiched between a pair of electrodes; and forming one film formation region related to a component of the organic electroluminescent element, which is made of a uniform film forming material, in accordance with an opening of a film forming mask, wherein a first component of the organic electroluminescent element is first formed in accordance with the opening of the film forming mask, the setting of the film forming mask is changed, and a second component of the organic electroluminescent element is formed on the first component of the organic electroluminescent element by the same film forming material, and wherein the setting of the film forming mask is changed by moving different openings of the film forming mask onto the film formation region, the film forming mask having openings formed of same shape is moved by a distance equal to an integer multiple of a pitch.

5. A producing method of an organic EL panel, comprising:

preparing at least an organic electroluminescent element including at least an organic layer having an organic electroluminescent layer sandwiched between a pair of electrodes; and forming one film formation region related to a component of the organic electroluminescent element, which is made of a uniform film forming material, in accordance with an opening of a first film forming mask, wherein a first component of the organic electroluminescent element is first formed in accordance with the opening of the first film forming mask, the setting of the first film forming mask is changed, and a second component of the organic electroluminescent element is formed on the first component of the organic electroluminescent element by the same film forming material, and wherein the setting of the first film forming mask is changed by replacing the first film forming mask with a second film forming mask having a same pattern of openings.

6. The producing method of the organic EL panel according to claim 5, wherein replacing the first film forming mask with the second film forming mask and forming the second component of the organic electroluminescent element diminish a potential defect in the organic electroluminescent element.

7. A producing method of an organic EL panel comprising:

preparing an organic electroluminescent element including an organic layer having an organic electroluminescent layer sandwiched between a pair of electrodes;

wherein the organic electroluminescent element corresponds to a film formation region that is formed of multiple layers of a film forming material formed on each other by multiple-setting of a film forming mask and respectively multiple-forming with the same film forming material, and wherein the multiple-setting of the film forming mask and the multiple-forming diminish a potential defect in the organic electroluminescent element.

* * * * *